(12) United States Patent
Vassalli

(10) Patent No.: US 6,313,041 B1
(45) Date of Patent: Nov. 6, 2001

(54) METHOD OF ENHANCING THE RATE OF REMOVAL OF A LAYER OF LIGHT-SENSITIVE MATERIAL AFTER AN ETCHING STEP IN THE FABRICATION OF SEMICONDUCTOR ELECTRONIC DEVICES

(75) Inventor: Omar Vassalli, Pradalunga (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/561,392

(22) Filed: Apr. 28, 2000

(30) Foreign Application Priority Data

Apr. 30, 1999 (IT) ................................ MI99A0920

(51) Int. Cl.$^7$ ..................................................... H01L 21/00
(52) U.S. Cl. ............................ 438/706; 216/58; 438/704; 438/715; 134/30
(58) Field of Search ..................................... 438/689, 704, 438/706, 710, 725, 748, 715; 216/58, 92; 134/30, 31

(56) References Cited

U.S. PATENT DOCUMENTS

| | | | |
|---|---|---|---|
| 3,890,176 | * | 6/1975 | Bolon ................................ 438/715 X |
| 4,863,561 | * | 9/1989 | Freeman et al. .................. 438/715 X |
| 5,112,437 | * | 5/1992 | Watanabe et al. .................... 438/706 |

* cited by examiner

*Primary Examiner*—William A. Powell
(74) *Attorney, Agent, or Firm*—Theodore E. Galanthay; Robert Iannucci; Seed IP Law Group, PLLC

(57) ABSTRACT

Presented is a method of enhancing the rate of removal of a photoresist layer from wafers of semiconductor material after the latter have gone through various process steps to define the patterns of integrated circuits. The method includes heating the wafer and treating it with low-pressure steam in a vacuum environment before starting to remove the photoresist by plasma or wet solutions. This pretreatment of the photoresists allows the time for removing the photoresist to be reduced substantially and eliminates problems from residue.

19 Claims, 2 Drawing Sheets

METHOD OF ENHANCING THE RATE OF REMOVAL OF A LAYER OF LIGHT-SENSITIVE MATERIAL AFTER AN ETCHING STEP IN THE FABRICATION OF SEMICONDUCTOR ELECTRONIC DEVICES

TECHNICAL FIELD

This invention relates to a method of enhancing the rate of removal of a layer of light-sensitive material in the fabrication of electronic devices on wafers of semiconductor material for which at least one etching step through a layer at least partially protected by said light-sensitive material is provided.

More particularly, the invention relates to a novel processing method whereby the process of removing a layer of photoresist can be made quicker and more effective, and in the ensuing description reference will be made to this application field for convenience of explanation only.

BACKGROUND OF THE INVENTION

Photoresist is an organic material which is employed to define by photolithography predetermined patterns in layers of materials commonly used in the processes for fabricating semiconductor electronic devices from monocrystalline silicon wafers, for example.

In this field, the semiconductor silicon wafers are required to undergo a plurality of chemical-physical treatments directed to define complex layouts of monolithically integrated electronic circuits thereon.

Particularly where submicron patterns are to be defined, a processing technique known as plasma etching is extensively used whereby thin films of conductive and dielectric materials can be etched.

As an example, FIG. 1 of the accompanying drawings shows schematically a portion 1 of a semiconductor substrate 2 on top of which a layer or film 3 of a plasma etch-susceptible material, e.g., a dielectric layer, a layer of polycrystalline silicon, or a metallization layer, has been deposited. A protective mask 4, e.g., of a photoresist, is provided on top of this layer 3 to be etched.

In order to define patterns in the film 3 protected by the mask 4, the semiconductor must be subjected to a plasma etching step that will remove some of the film 3 material, through openings made in the mask 4.

After the end of the plasma etching step, as shown in FIG. 2, the photoresist mask 4 must be removed. Removing the photoresist mask 4 uncovers the patterns of the finished product as shown in FIG. 3.

The mask 4 removal is usually effected by subjecting the wafer to a second plasma or wet treatment which is selective enough to remove the mask of organic material without affecting the layers underneath.

Removing the protective mask 4 is often a fairly lengthy procedure.

As the technology progresses, the number of films or layers wherein patterns are to be defined tends to increase with the complexity of the microelectronic device. Consequently, the removal of the photoresist mask is a reiterative process that is carried out several times for each etched layer in the course of the device fabrication.

There is, therefore, a growing demand for techniques which allow the protective mask to be removed as effectively and rapidly as possible.

The prior art techniques have been directed to fill this demand by developing more aggressive removal processes and at the same time optimizing the parameters involved in the process, such as pressure, temperature, the type of reactant employed, etc.

SUMMARY OF THE INVENTION

Embodiments of the invention provide a method of effecting a removal of a light-sensitive material layer in the process of fabricating electronic devices on wafers of semiconductor material, which can make the removal both quicker and more effective. More particularly, removing the layer of light-sensitive material is made quicker and more effective. Even though embodiments according to the invention add additional steps, which thereby takes additional time, the benefit for using this extra step is outweighed by its reduction in overall processing time.

Presented is a method that subjects the semiconductor material wafer, while still covered with the mask to be removed, to a steam medium. Preferably, the steam interaction can be effected as a thermal treatment, using low-pressure steam for a predetermined time period.

Advantageously and preferably, the treatment is applied at a relatively high temperature in the 200° to 300° C. range, using steam in amounts between 500 and 2,000 sccm (standard cubic centimeters/per minute) and under a pressure from 5,000 to 15,000 mTorr for a few seconds, e.g., 10–30 seconds. Subsequent to this treatment, the protective mask is removed by conventional techniques, but within a much shorter time.

The features and advantages of a method according to this invention will become apparent from the following description of an embodiment thereof, given by way of non-limitative example with reference to the accompanying drawings.

DETAILED DESCRIPTION OF THE INVENTION

A preferred embodiment of the method according to the invention will now be described as applied to the fabrication of electronic devices and circuits integrated monolithically into semiconductor material. The process steps and structures described herein are not exhaustive of a process flow for fabricating integrated circuits. In fact, the invention can be practiced in conjunction with integrated circuit fabricating techniques currently adopted in the industry, and only such conventional process steps will be described as are deemed necessary to an understanding of the invention. Discussion of structures or processes well known to those skilled in the art has been eliminated for brevity.

An embodiment of the invention has been developed in connection with the etching steps that follow the formation of metallization layers for electric connections of the integrated circuit. However, the inventive principles could also be applied to other steps of the process of fabricating integrated circuits.

Figure 1:
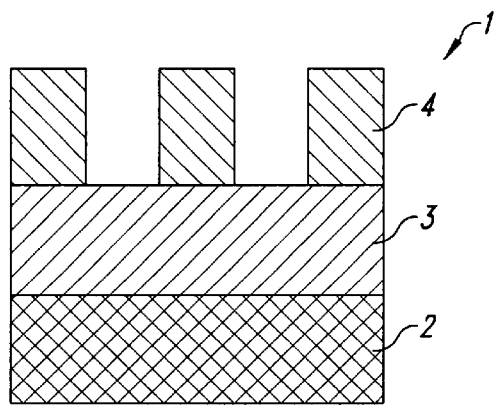
FIGS. 1, 2 and 3 are respective vertical cross-section views which show a portion of semiconductor material wherein a circuit pattern is defined according to both the conventional and techniques according to embodiments of the invention.
Figure 2:
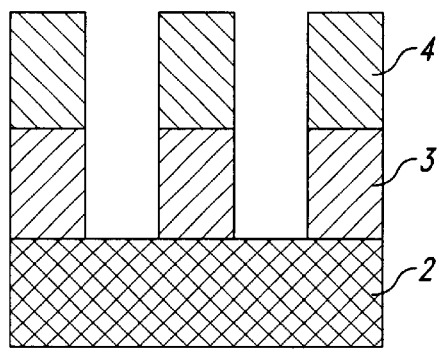

Shown in FIG. 1 are both the protective mask 4 of light-sensitive material, e.g., a photoresist, and the underlying film 3 to be etched. The process step that takes place between FIGS. 1 and 2 is a plasma etching of the film 3 in the pattern predetermined by the protective mask 4. It should be noted, however, that embodiments of the invention can be applied to chemical etching using liquid solutions as well as plasma processing.

Figure 3:
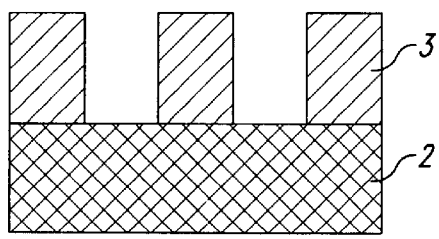

The process step that takes place between FIGS. 2 and 3 is a removal of the protective mask 4 from the substrate 2, once the patterns have been defined by the previous plasma etching step.

Advantageously, the invention provides a method of making the removal of the photoresist mask quicker and more effective than with prior removing methods.

According to the prior art, the wafer is transferred into a mask removing apparatus including a removal chamber. The resist layer is removed under a plasma medium, typically oxygen ions. Prior art processes, also at this stage, subjected the wafer to a treatment effective to prevent corrosion of the metallization layers.

However, a slowing factor in the removal of the light-sensitive material layer 4 is the presence of a thin surface "skin" that has formed on the layer walls during the etching of the layer 3 beneath. This skin is composed of organic materials which are quite difficult to remove by a standard type of plasma etch.

In embodiments of this invention, the semiconductor wafer is exposed to a steam medium subsequently to the etching of the underlying film 3, but before the mask 4 is removed.

The medium to which the semiconductor wafer is exposed should contain water in its gaseous, but non-ionized, form; that is not as plasma.

More particularly, the wafer of semiconductor material is subjected to a thermal treatment directly after the plasma etching step.

Advantageously and preferably, this treatment is applied at a relatively high temperature in the 200° to 300° C. range, using steam in an amount between 500 and 2,000 sccm, and under a pressure in the range of 5,000 to 15,000 mTorr for a few seconds, for instance between 10 and 30.

This treatment can be applied in the same apparatus chamber where the mask is usually removed, or alternatively in a specially arranged chamber if the mask is removed using liquid solutions.

The chamber is only required to be arranged for producing a lower pressure therein than the atmospheric pressure, arranged to be heated or equipped with a means of heating the wafers of semiconductor material, and equipped with a steam dispensing device.

Subsequently to this treatment, the protective mask 4 is removed by conventional techniques, but within a much shorter time.

It has been found that, surprisingly, the rate of the subsequent plasma etching for the mask removal is increased, even twice as high, by embodiments of the invention. It has been ascertained, however, that the wafer should not be placed in contact with oxygen prior to exposing it to the steam. This would retard the resist removal.

The physical mechanism appears to depend on two different phenomena or effects. A first effect is thought to be one of water absorption into the organic material of the mask, resulting in the material becoming more readily etchable. It could also be that the surface layer or skin is removed or partially removed by the steam.

The second effect is one of removal by volatilization of any material films formed during the patterning of the integrated circuit which make removing the mask more difficult because they intervene between the mask and the chemicals used for its removal.

Figure 4:
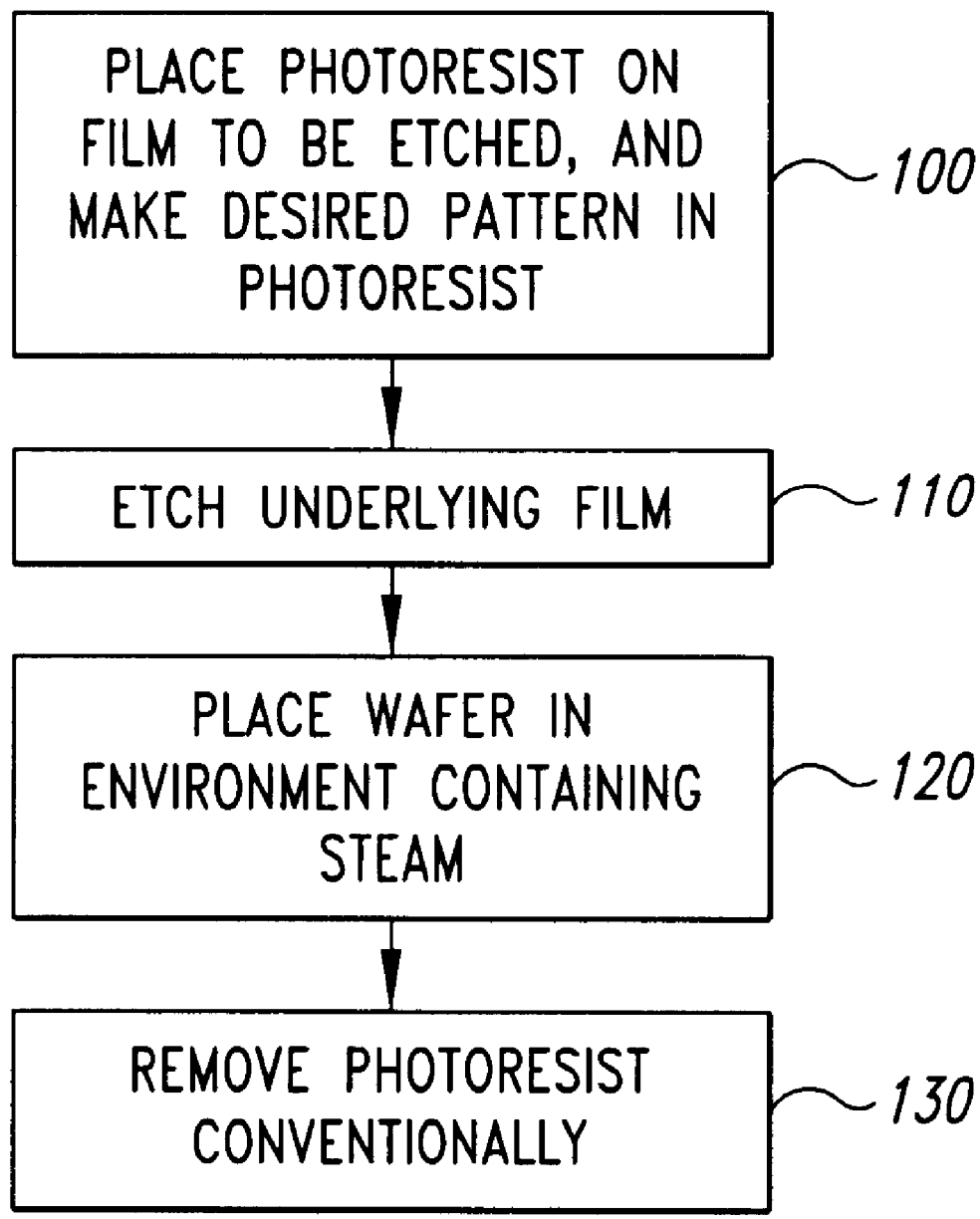
FIG. 4 is a flowchart showing steps used according to an embodiment of the inventive process.

With reference to FIG. 4, a flowchart showing steps in one embodiment of the invention is shown. Within that figure, a step 100 begins with placing a photoresistive layer 4, for example an organic containing photoresist mask onto a film 3 to be etched. The film 3 is disposed on the semiconductor substrate 2, or wafer. After the film 3 has been etched in a step 110, the wafer is placed in an environment containing steam in a step 120. Preferably, this step takes place in a vacuum chamber with a pressure of between 5,000 and 15,000 mTorr. The wafer need only spend a short time, and preferable between 10 and 30 seconds exposed to the steam. Additionally, the temperature of the chamber should be in the 200° to 300° C. temperature range, and the amount of steam is preferably between 500 and 2,000 sccm, It is important that the wafer not be placed in contact with oxygen between the etching step 110 and the steam treatment step 120.

Once the steam treatment step 120 is complete, the photoresistive mask can be removed conventionally in a step 130. The removal of the photoresistive mask after being subjected to the steam treatment step 120 will be easier and quicker than had the steam treatment not been performed.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method of enhancing the rate of removal of a layer of light-sensitive material in the fabrication of electronic devices on wafers of semiconductor material for which at least one etching step through a layer at least partially protected by said light-sensitive material is provided, including a thermal treatment of said light-sensitive material carried out in a steam medium.

2. The method according to claim 1 wherein the thermal treatment is applied in a low pressure environment.

3. The method according to claim 1 wherein the thermal treatment is applied after the at least one etching step.

4. The method according to claim 1 wherein the thermal treatment is applied before the at least one etching step.

5. The method according to claim 1 wherein the thermal treatment is carried out in a mask removing apparatus provided with an isolated chamber wherein a lower pressure than the atmospheric pressure is produced.

6. The method according to claim 5 wherein the isolated chamber is adapted to be heated or includes a means of heating the wafers of semiconductor material.

7. The method according to claim 6 wherein the isolation chamber is adapted to be heated by steam.

8. The method according to claim 5 wherein the apparatus is equipped with a steam dispensing device.

9. The method according to claim 5 wherein the mask removing apparatus is equipped with a pressure control device.

10. The method according to claim 1 wherein the thermal treatment is applied at a temperature between the range of 200° to 300° C.

11. The method according to claim 1 wherein the steam medium is delivered in amounts between 500 and 2000 sccm.

12. The method according to claim 1 wherein the thermal treatment is performed at a pressure between 5,000 and 15,000 mTorr.

13. The method according to claim 1 wherein the thermal treatment is applied for a few seconds.

14. The method according to claim 13 wherein the thermal treatment is applied for between 10 and 30 seconds.

15. A method of removing an energy-sensitive material disposed on a layer of a semiconductor substrate, the layer having been etched during a semiconductor fabrication process, the method comprising:

after the layer has been etched, treating the energy-sensitive material by exposing the semiconductor substrate to an atmosphere containing steam;

removing the substrate from the atmosphere containing steam; and stripping the energy-sensitive material from the layer that has been etched.

16. The method of claim 15 wherein treating the energy-sensitive material by exposing it to an atmosphere containing steam comprises:

placing the substrate in an isolated chamber of a mask removing apparatus;

lowering a pressure in the isolated chamber to less than atmosphereic pressure;

raising a temperature of the energy-sensitive material to a temperature higher than standard room temperature; and passing a flow of steam over the energy-sensitive material for a duration of time.

17. The method of claim 16 wherein the pressure is lowered to between 5,000 and 15,000 mTorr.

18. The method of claim 16 wherein the temperature is brought to between 200 to 300° C.

19. The method of claim 16 wherein the rate of steam flow over the energy-sensitive material is between 500 and 2000 sccm.

* * * * *